(12) United States Patent
Sun et al.

(10) Patent No.: US 10,340,906 B2
(45) Date of Patent: Jul. 2, 2019

(54) INTEGRATED BOOTSTRAP HIGH-VOLTAGE DRIVER CHIP AND TECHNOLOGICAL STRUCTURE THEREOF

(71) Applicants: SOUTHEAST UNIVERSITY, Wuxi (CN); SOUTHEAST UNIVERSITY-WUXI INTEGRATED CIRCUIT TECHNOLOGY RESEARCH INSTITUTE, Wuxi (CN)

(72) Inventors: Weifeng Sun, Wuxi (CN); Yunwu Zhang, Wuxi (CN); Kuo Yu, Wuxi (CN); Jing Zhu, Wuxi (CN); Shen Xu, Wuxi (CN); Qinsong Qian, Wuxi (CN); Siyang Liu, Wuxi (CN); Shengli Lu, Wuxi (CN); Longxing Shi, Wuxi (CN)

(73) Assignees: SOUTHEAST UNIVERSITY, Wuxi (CN); SOUTHEAST UNIVERSITY-WUXI INTEGRATED CIRCUIT TECHNOLOGY RESEARCH INSTITUTE, Wuxi (CN)

( * ) Notice: Subject to any disclaimer, the term of this patent is extended or adjusted under 35 U.S.C. 154(b) by 0 days.

(21) Appl. No.: 15/779,432

(22) PCT Filed: Jan. 23, 2017

(86) PCT No.: PCT/CN2017/072153
§ 371 (c)(1),
(2) Date: May 25, 2018

(87) PCT Pub. No.: WO2017/143898
PCT Pub. Date: Aug. 31, 2017

(65) Prior Publication Data
US 2018/0262186 A1 Sep. 13, 2018

(30) Foreign Application Priority Data
Feb. 23, 2016 (CN) .......................... 2016 1 0098736

(51) Int. Cl.
H02M 3/07 (2006.01)
H03K 17/06 (2006.01)
(Continued)

(52) U.S. Cl.
CPC ....... H03K 17/063 (2013.01); H01L 27/0727 (2013.01); H01L 29/7835 (2013.01);
(Continued)

(58) Field of Classification Search
CPC ............ Y02B 70/1466; H01L 2924/00; H01L 2924/0002; H01L 2924/00014
See application file for complete search history.

(56) References Cited

U.S. PATENT DOCUMENTS

2011/0309873 A1* 12/2011 Miller ............ H03K 19/018521
327/333

* cited by examiner

*Primary Examiner* — Sibin Chen
(74) *Attorney, Agent, or Firm* — CBM Patent Consulting, LLC

(57) ABSTRACT

Parasitic high-voltage diodes implemented by integration technology in a high-voltage level shift circuit are used for charging a bootstrap capacitor $C_B$, wherein a power supply end of the high voltage level shift circuit is a high-side floating power supply VB, and a reference ground is a floating voltage PGD that is controlled by a bootstrap control circuit. A first parasitic diode $D_{B1}$ and a second parasitic diode $D_{B2}$ are provided between the VB and the PGD. The bootstrap control circuit is controlled by a high-side signal and a low-side signal.

6 Claims, 15 Drawing Sheets

(51) Int. Cl.
  *H03K 17/16* (2006.01)
  *H03K 17/687* (2006.01)
  *H03K 19/0185* (2006.01)
  *H01L 27/07* (2006.01)
  *H01L 29/78* (2006.01)
  *H01L 29/423* (2006.01)
  *H01L 29/10* (2006.01)
(52) U.S. Cl.
  CPC ....... *H03K 17/162* (2013.01); *H03K 17/6871* (2013.01); *H03K 19/0185* (2013.01); *H01L 29/1083* (2013.01); *H01L 29/42368* (2013.01); *H03K 2217/0063* (2013.01); *H03K 2217/0081* (2013.01)

INTEGRATED BOOTSTRAP HIGH-VOLTAGE DRIVER CHIP AND TECHNOLOGICAL STRUCTURE THEREOF

TECHNICAL FIELD

The present invention relates to the bootstrap technologies in a half-bridge driver circuit, and more particularly, to an integrated bootstrap high-voltage driver chip and a technological structure thereof.

BACKGROUND

The half-bridge driver circuit is widely applied in the fields of motor drive, electronic ballast, switching power supply, etc., and is used for driving two power switch devices connected in a totem-pole manner to make the two power switch devices be alternately conducted. As shown in FIG. 1, a conventional half-bridge driver chip comprises a low-side channel logic circuit and a high-side channel logic circuit, wherein the low-side channel logic circuit comprises a low-side signal input circuit, a low-side delay circuit and a low-side signal output circuit; the high-side channel logic circuit comprise a high-side signal input circuit, a narrow pulse generation circuit, a high-voltage level shift circuit and a high-side channel high-basin logic circuit; the high-voltage level shift circuit which is used as an interface circuit of circuits in a high-voltage area and a low-voltage area (located at the edge of an isolation structure, and needing to work at several hundred volts) is composed of high-voltage power switch devices (M01 and M02), resistive loads (RL1 and RL2) and Zener clamping diodes (D01 and D02); the high-side channel high-basin logic circuit is located in a high-voltage circuit area and is powered by the high-side floating power supply VB, other circuits are located at a low-voltage circuit area and are powered by a low-side fixed power supply VCC, and both the circuits in the low-voltage area and the high-voltage area work under a voltage ranging from 10V to 20V. In order to increase the utilization efficiency of the power supply, the half-bridge driver chip is powered by a single power supply, wherein the low-voltage area is directly powered by a direct current power supply VCC, while the high-voltage area is in a floating state, and is powered by an external bootstrap capacitor. When a lower tube (low-side tube) $M_L$ in the half-bridge structure is switched on, and a higher tube (high-side tube) $M_H$ is switched off, the voltage of the high-side floating power supply VB drops with the voltage drop of a high-side floating ground VS, when the voltage of the VB drops below the voltage of the VCC, and the differential voltage between the two exceeds the turning-on voltage drop of a high-voltage bootstrap diode $D_B$, the VCC charges the bootstrap capacitor $C_B$ through the bootstrap diode $D_B$; when the higher tube is switched on and the lower tube is switched off, the voltage of the VB increases with the voltage increasing of the VS, the voltage of the VB far exceeds the voltage of the VCC, and the bootstrap diode $D_B$ is switched off, and the high-basin circuit is powered by the bootstrap capacitor $C_B$.

The conventional half-bridge driver circuit with an external bootstrap diode $D_B$ has obviously defects: the externally arranged discrete device (bootstrap diode $D_B$) will increase additional costs of the circuit, and will increase the system complexity; the high-voltage bootstrap diode has a higher turning-on voltage drop, which will finally affect the charging on the capacitor $C_B$; moreover, the higher the withstand voltage of the diode is, the larger the turning-on voltage drop is; and the reverse recovery current of the bootstrap diode $D_B$ will cause electric leakage of the bootstrap capacitor.

In order to realize the integration of the bootstrap diode, a BCD (Bipolar CMOS DMOS) technology can be used to integrate the high-voltage bootstrap diode into the half-bridge driver chip, but the high-voltage bootstrap diode made by this technology has larger leakage and will bring about very large leakage that affects the system reliability, and meanwhile, the charging efficiency of the bootstrap capacitor is decreased. An SOI (Silicon On Insulator) technology can also be used to integrate the high-voltage bootstrap diode into the half-bridge driver chip, but the half-bridge driver chip made by the SOI technology will greatly increase the cost of the chip and reduce the competitiveness of the product.

Therefore, U.S. Pat. No. 7,215,189B proposes a bootstrap diode emulator circuit with dynamic back-gate biasing, as shown in FIG. 2, to replace the bootstrap diode $D_B$ in FIG. 1. The bootstrap diode emulator circuit in the patent comprises a high-voltage power switch device LDMOS and a control circuit; an integrated high-voltage power switch device LDMOS is turned on and off to stimulate the positive turning-on and reverse turning-off functions of a bootstrap diode $D_B$; when a low-side output LO is at a high level, the LDMOS is turned on, and a low-side fixed power supply VCC charges a bootstrap capacitor $C_B$ through the LDMOS, and when the low-side output LO is at a low level, the LDMOS is turned off, and the low-side fixed power supply VCC stops charging the bootstrap capacitor $C_B$. However, this technology has the defect of low charging efficiency. To this end, U.S. Pat. No. 7,456,658B2 proposes an improved solution: a voltage comparator circuit is added for a VCC and a VB; when the high-side output and the low-side output are at a low level at the same time, the comparator is enabled, and the LDMOS is turned on in the case that the voltage value of the VB is smaller than a certain value, and the VCC charges the bootstrap capacitor. However, the high-voltage power switch device LDMOS and the control circuit added in the bootstrap diode emulator circuit adopted by the patent greatly increase the complexity of the circuit, and the area of the chip is greatly increased; moreover, the cost is also increased; moreover, compared with the diode, the on-resistance of the LDMOS device is relatively large, which seriously reduces the charging speed of the bootstrap circuit, so that the technical solution is not suitable for some applications, such as a high-frequency half-bridge driver circuit.

SUMMARY

Aiming at the above-mentioned problems in the related arts, the present invention provides an integrated bootstrap high-voltage driver chip and a technological structure thereof, which makes full use of the characteristics of the high-voltage level shift circuit (006) in the half-bridge driver circuit and the technological structure thereof, uses the high-voltage diodes made by integration technology to substitute the external high-voltage diode in the related art, and is provided with the bootstrap control circuit (003) to control bootstrap charging.

The present invention adopts the following technical solutions.

An integrated bootstrap high-voltage driver chip based on a driver circuit of a half-bridge structure comprises a low-side channel logic circuit (001) and a high-side channel logic circuit (002), wherein the high-side channel logic circuit (002) comprises a high-side signal input circuit (004), a narrow pulse generation circuit (005), a high-voltage level shift circuit (006) and a high-side channel high-basin logic circuit (007) composed of two pulse filtering circuits with the same structure, an RS trigger and a high-side signal output circuit; the low-side channel logic circuit (001) comprises a low-side signal input circuit (008), a low-side delay circuit (009) and a low-side signal output circuit (010); a high-side input signal HIN is connected to the input end of the high-side signal input circuit (004), an output signal CIN1 of the high-side signal input circuit (004) is connected to the input end of the narrow pulse generation circuit (005), a low-voltage set signal SET and a low-voltage reset signal RESET outputted by the narrow pulse generation circuit (005) are respectively connected to two input ends of the high-voltage level shift circuit (006), a high-voltage set signal VRS and a high-voltage reset signal VRR outputted by the high-voltage level shift circuit (006) are respectively connected to two input ends of the high-side channel high-basin logic circuit (007), and a high-side output signal HO outputted by the high-side channel high-basin logic circuit (007) is used as a gate driving signal of a high-side tube in the half-bridge structure; a low-side input signal LIN is connected to the input end of the low-side signal input circuit (008), an output signal CIN2 of the low-side signal input circuit (008) is connected to the input end of the low-side delay circuit (009), the output end of the low-side delay circuit (009) is connected to the input end of the low-side signal output circuit (010), the output of the low-side signal output circuit (010) is a low-side output signal LO and is used as a gate driving signal of a low-side tube in the half-bridge structure; in the circuits above, the high-voltage level shift circuit (006) and the high-side channel high-basin logic circuit (007) are located in a high-voltage circuit area and powered by a high-side floating power supply VB, the other circuits are all located in a low-voltage circuit area and powered by a low-side fixed power supply VCC; in order to increase the utilization efficiency of the power supply, the half-bridge driver chip is powered by a single power supply, wherein the low-voltage area circuit is directly powered by a direct current power supply VCC, while the high-voltage area circuit is in a floating state, and is powered by an external bootstrap diode $D_B$ and an external bootstrap capacitor $C_B$ in a bootstrap manner; the power supply of the high-side signal input circuit (004), the narrow pulse generation circuit (005) and the low-side channel logic circuit (001) is the low-side fixed power supply VCC, a logic ground is a ground signal COM, the power supply of the high-side channel high-basin logic circuit (007) is the high-side floating power supply VB, a logic ground is a high-side floating ground VS, and the bootstrap capacitor $C_B$ is connected between the high-side floating power supply VB and the high-side floating ground VS; the high-voltage level shift circuit (006) is used as an interface of the high-voltage area circuit and the low-voltage area circuit, and comprises two subcircuits with the same structure, each subcircuit comprises a high-voltage switch tube, a Zener clamping diode and a load, the Zener clamping diode is connected to the load in parallel, the drain of the high-voltage switch tube in each subcircuit is connected to the anode of the Zener clamping diode in the subcircuit and the connecting end of the load, cathodes of the Zener clamping diodes in the two subcircuits are mutually connected to the connecting ends of the loads, and are connected to the high-side floating power supply VB; in the two subcircuits, the grid of the high-voltage switch tube of one subcircuit is connected to the low-voltage set signal SET outputted by the narrow pulse generation circuit (005), the drain of the high-voltage switch tube of the subcircuit outputs the high-voltage set signal VRS, the grid of the high-voltage switch tube of the other subcircuit is connected to the low-voltage reset signal RESET outputted by the narrow pulse generation circuit (005), and the drain of the high-voltage switch tube of the subcircuit outputs the high-voltage reset signal VRR.

In the integrated bootstrap high-voltage driver chip, the bootstrap diodes $D_B$ is at least one parasitic diode implemented by integration technology, and matched with the bootstrap control circuit (003) provided to realize a bootstrap charging process together, the input signals of the bootstrap control circuit (003) are respectively the output signal CIN1 of the high-side signal input circuit (004) and the output signal CIN2 of the low-side signal input circuit (008), the output signal of the bootstrap control circuit (003) is a reference ground PGD, the reference ground PGD is connected to sources of two high-voltage switch tubes in the high-voltage level shift circuit (006), when one parasitic diode is provided, the parasitic diode is defined as a first parasitic diode $D_{B1}$, the anode of the first parasitic diode $D_{B1}$ is connected to the reference ground PGD, and the cathode of the bootstrap control circuit is connected to the high-side floating power supply VB.

When the output signal PGD of the bootstrap control circuit (003) is at a low level which is a ground signal COM, the high-voltage level shift circuit (006) conducts level shift to the high-side signal; when the output signal PGD of the bootstrap control circuit (003) is at a high level which is a low-side fixed power supply voltage VCC, and when the input signal of the high-voltage level shift circuit (006) is at a low level which is the ground signal COM, the high-voltage level shift circuit (006) can also be used as a current channel for the VCC to charge the external bootstrap capacitor, which realizes to charge the bootstrap capacitor by the low-side fixed power supply VCC under the premise of guaranteeing the normal work of the high-voltage level shift circuit.

The charging process is as follows.

When the input signal CIN1 of the bootstrap control circuit (003) is at a low level which is the ground signal COM, and the input signal CIN2 is at a high level which is the low-side fixed power supply VCC, the output signal PGD of the bootstrap control circuit (003) is at a high level which is the low-side fixed power supply VCC, at the moment, the reference ground PGD charges the bootstrap capacitor $C_B$ through the first parasitic diode $D_{B1}$; when the input signal CIN1 of the bootstrap control circuit (003) is at a low level, and the input signal CIN2 is at a low level which is the ground signal COM, the output signal PGD is at a high level (the low-side fixed power supply VCC), at the moment, the PGD charges the bootstrap capacitor through the first parasitic diode $D_{B1}$; when the input signal CIN1 is at a high level, and the input signal CIN2 is at a low level, or when the input signals CIN1 and CIN2 are at a high level at the same time, the output signal PGD is at a low level which is the ground signal COM, at the moment, the first parasitic diode $D_{B1}$ is in a turned-off state, and a charging action is stopped.

The load in the high-voltage level shift circuit (006) can be a resistive load or capacitive load.

A second parasitic diode $D_{B2}$ can be arranged between the source and the drain of any one of the two high-voltage switch tubes in the high-voltage level shift circuit (006), or a second parasitic diode $D_{B2}$ can be respectively arranged between the sources and the drains of the two high-voltage switch tubes, the anode of the second parasitic diode $D_{B2}$ is connected to the source of the high-voltage switch tube, and the cathode of the bootstrap control circuit is connected to the drain of the high-voltage switch tube.

The charging process is as follows.

When the low-side output signal LO is at a high level and the high-side output signal HO is at a low level, or when the low-side output signal LO is at a low level and the high-side output signal HO is at a low level, the output signal PGD of the bootstrap control circuit (003) is at a high level which is the low-side fixed power supply VCC, at the moment, if the differential voltage between the voltage of the PGD and the voltage of the high-side floating power supply VB is greater than the turning-on voltage drop of the first parasitic diode or the second parasitic diode, then the PGD charges the external bootstrap capacitor $C_B$ of the chip through the first parasitic diode or the second parasitic diode, if the differential voltage between the voltage of the PGD and the voltage of the high-side floating power supply VB is smaller than the turning-on voltage drop of the first parasitic diode or the second parasitic diode, then the first parasitic diode and the second parasitic diode are turned off, and the charging action to the bootstrap capacitor $C_B$ is stopped; under other conditions, the output PGD of the bootstrap control circuit (003) is the ground signal COM, at the moment, the first parasitic diode or the second parasitic diode is in a turned-off state, so that signal transmission is implemented by the high-voltage level shift circuit (006).

The bootstrap control circuit (003) comprises five phase inverters INV01, INV02, INV03, INV04 and INV05, two nand gates NAND01 and NAND02, and a nor gate NOR01, the output signal CIN1 of the high-side signal input circuit (004) and the output signal CIN2 of the low-side signal input circuit (008) are respectively connected to the input ends of the phase inverters INV01 and INV02, the output end of the phase inverter INV01 is respectively connected to one input end of the nand gate NAND01 and one input end of the nand gate NAND02, the other input end of the nand gate NAND01 is connected to the input end of the phase inverter INV02, the other input end of the nand gate NAND02 is connected to the output end of the phase inverter INV02, the output end of the nand gate NAND01 is connected to the input end of the phase inverter INV03, the output end of the nand gate NAND02 is connected to the input end of the phase inverter INV04, the output end of the phase inverter INV03 and the output end of the phase inverter INV04 are respectively connected to the two input ends of the nor gate NOR01, the output end of the nor gate NOR01 is connected to the input end of the phase inverter INV05 and one end of a capacitor $C_D$, the other end of the capacitor $C_D$ is connected to the ground signal COM, and the output signal of the phase inverter INV05 is the reference ground PGD.

A technological structure of the integrated bootstrap high-voltage driver chip mentioned above comprises a low basin composed of a first doping-type base (101), a second doping-type buried layer (102), a second doping-type trap (103) and a first doping-type trap (104); a high-voltage switch tube composed of a first doping-type trap (105), a second doping-type buried layer (106), a first doping-type body contact (107), a second doping-type source contact (108), a second doping-type drain contact (109), a grid (110) and a second doping-type trap (111); and a high basin composed of a second doping-type buried layer (112), a second doping-type trap (113) and a first doping-type trap (114); the low basin being close to the source of the high-voltage switch tube, and the high basin being close to the drain of the high-voltage switch tube, wherein:

the low basin is provided with at least one second doping-type trap (103) and at least one first doping-type trap (104), and the first doping-type trap (104) is always surrounded by the second doping-type trap (103) and the second doping-type buried layer (102); the first doping-type base (101) is not connected to any electric potential; the first doping-type body contact (107) and the second doping-type source contact (108) are connected to the reference ground PGD; the second doping-type trap (113) in the high basin is electrically connected to the high-side floating power supply VB, and the second doping-type trap (103) in the low basin is electrically connected to the low-side fixed power supply VCC; all the low-voltage area circuits in the high-voltage driver chip are prepared in the first doping-type trap (104), and all the high-voltage area circuits are prepared in the first doping-type trap (114); a first parasitic diode is composed of the first doping-type base (101), the second doping-type buried layer (112) and the second doping-type trap (113), and a second parasitic diode is composed of the first doping-type base (101), the second doping-type buried layer (106) and a second doping-type trap (115).

The low-side channel logic circuit (001), the high-side signal input circuit (004), the narrow pulse generation circuit (005) and the bootstrap control circuit (003) are prepared in the first doping-type trap (104) in the low basin, the high-side channel high-basin logic circuit (007) is prepared in the first doping-type trap (114) in the high basin, and the output PGD of the bootstrap control circuit (003) is connected to the first doping-type body contact (107) and the second doping-type source contact (108) in the high-voltage switch tube.

Compared with the prior art, the present invention has the following advantages.

(1) The present invention makes full use of the structural characteristics of the high-voltage level shift circuit (006), and the parasitic high-voltage diodes exist between the reference ground of the output signal PGD of the bootstrap control circuit (003) and the high-side floating power supply VB; when the PGD is at a low level (ground signal COM), the high-voltage level shift circuit (006) can conduct level shift to the high-side signal; when the PGD is at a high level (low-side fixed power supply VCC) and the input signal of the high-voltage level shift circuit (006) is at a low level (ground signal COM), the high-voltage level shift circuit (006) can also be used as a current channel for the VCC to charge the external bootstrap capacitor. The function of charging the bootstrap capacitor by the low-side fixed power supply VCC under the premise of guaranteeing the normal work of the high-voltage level shift circuit is realized. The design of the present invention is very skillful; the present invention greatly simplifies the circuit structure, and also decreases the chip area and reduces the cost at the same time.

(2) Because the turning-on voltage drops of the first parasitic diode and the second parasitic diode of the present invention are smaller, the charging efficiencies of the first parasitic diode and the second parasitic diode are better than that of a general discrete high-voltage bootstrap diode. In the present invention, there are three channels for the VCC to charge the bootstrap capacitor $C_B$: one second parasitic diode $D_{B2}$, a clamping diode D01 and a load resistor RL1 form a charging path; the other second parasitic diode $D_{B2}$, a clamping diode D02 and a load resistor RL2 form a second charging path; the diode $D_{B1}$ forms a third charging path, and the bootstrap control circuit (003) controls the voltage of the PGD; when the PGD is at a high level (VCC), the VCC charges the external bootstrap capacitor $C_B$ through the three charging paths.

(3) The structure of the present invention is extremely simple. Except for the high-voltage power switch devices used in the high-voltage level shift circuit (006), no additional high-voltage power switch devices are included. Except for the parasitic diodes of the device or the chip itself, no additional integrated high-voltage diodes are included as well, which greatly simplifies the circuit structure and improves the reliability of the chip, and also decreases the chip area, and saves the manufacturing cost at the same time.

(4) The present invention has the characteristic that the charging speed of the bootstrap capacitor is fast, and the charging speed of the bootstrap capacitor is far faster than the charging speed of the bootstrap diode emulator circuit under the condition of the bootstrap capacitors with the same size. Therefore, the present invention can be applied to a half-bridge driver chip with a higher frequency.

DETAILED DESCRIPTION

Figure 3:
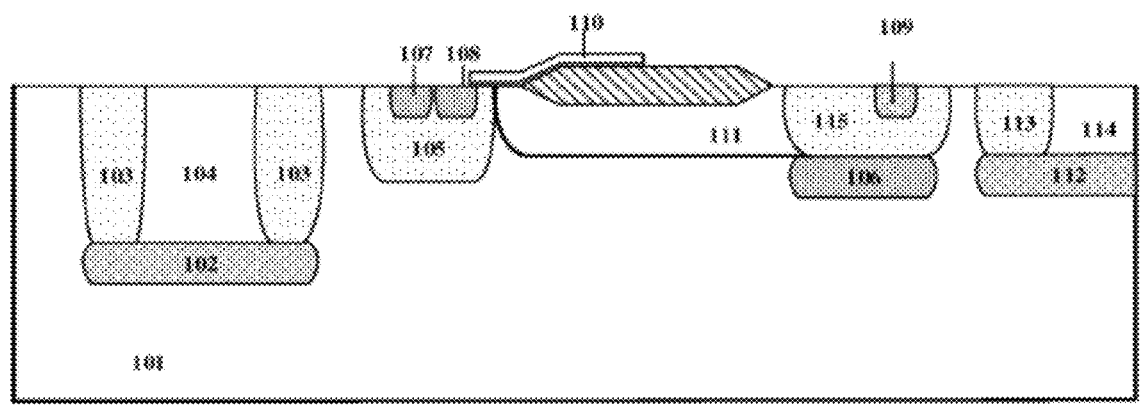
FIG. 3 is an implementation manner of a technology of an integrated bootstrap half-bridge driver chip according to the present invention.

Referring to FIG. 3, a technological structure of an integrated bootstrap high-voltage driver chip according to the present invention comprises a low basin composed of a first doping-type base 101, a second doping-type buried layer 102, a second doping-type trap 103 and a first doping-type trap 104; a high-voltage switch tube composed of a first doping-type trap 105, a second doping-type buried layer 106, a first doping-type body contact 107, a second doping-type source contact 108, a second doping-type drain contact 109, a grid 110 and a second doping-type trap 111; and a high basin composed of a second doping-type buried layer 112, a second doping-type trap 113 and a first doping-type trap 114; the low basin is close to the source of the high-voltage switch tube, and the high basin is close to the drain of the high-voltage switch tube. The low basin is provided with at least one second doping-type trap 103 and at least one first doping-type trap 104, and the first doping-type trap 104 is always surrounded by the second doping-type trap 103 and the second doping-type buried layer 102; the first doping-type base 101 is not connected to any electric potential; the first doping-type body contact 107 and the second doping-type source contact 108 are connected to the reference ground PGD; the second doping-type trap 113 in the high basin is electrically connected to the high-side floating power supply VB, and the second doping-type trap 103 in the low basin is electrically connected to the low-side fixed power supply VCC; all the low-voltage area circuits in the high-voltage driver chip are prepared in the first doping-type trap 104, and all the high-voltage area circuits are prepared in the first doping-type trap 114; a first parasitic diode is composed of the first doping-type base 101, the second doping-type buried layer 112 and the second doping-type trap 113, and a second parasitic diode is composed of the first doping-type base 101, the second doping-type buried layer 106 and a second doping-type trap 115.

Figure 4:
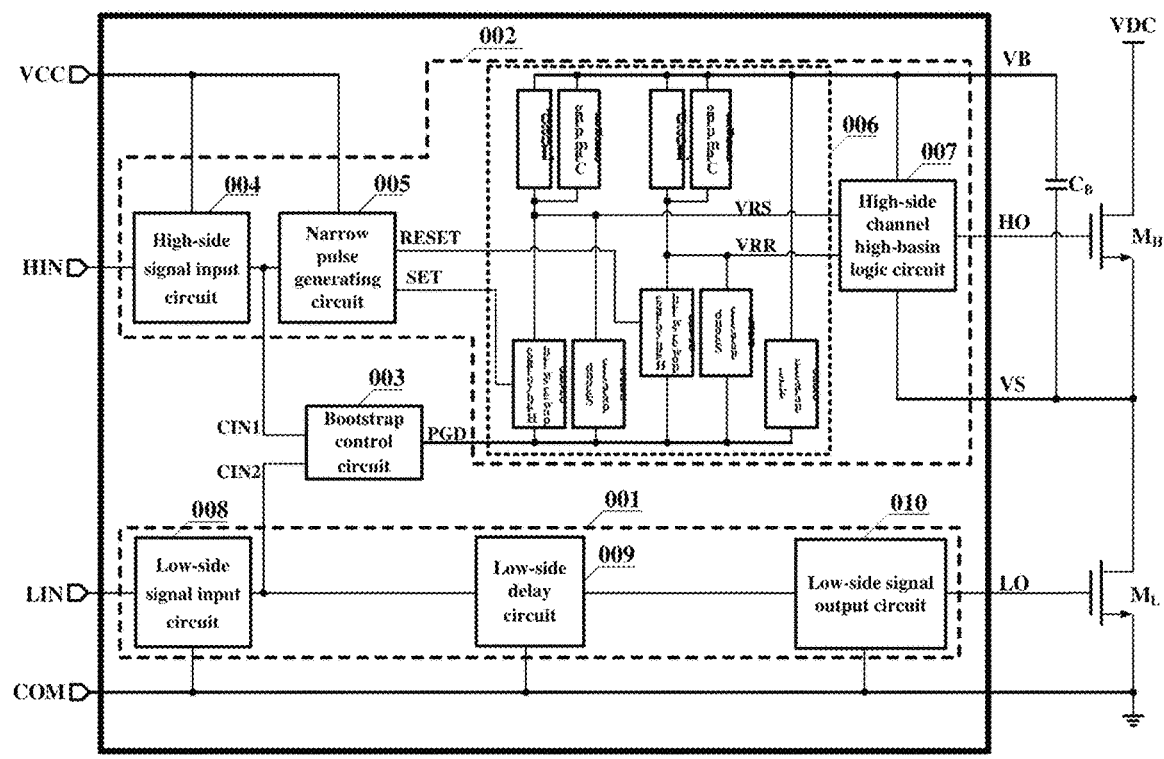
FIG. 4 is an integrated bootstrap half-bridge driver chip and a chip bootstrap circuit according to the present invention.
Figure 5:
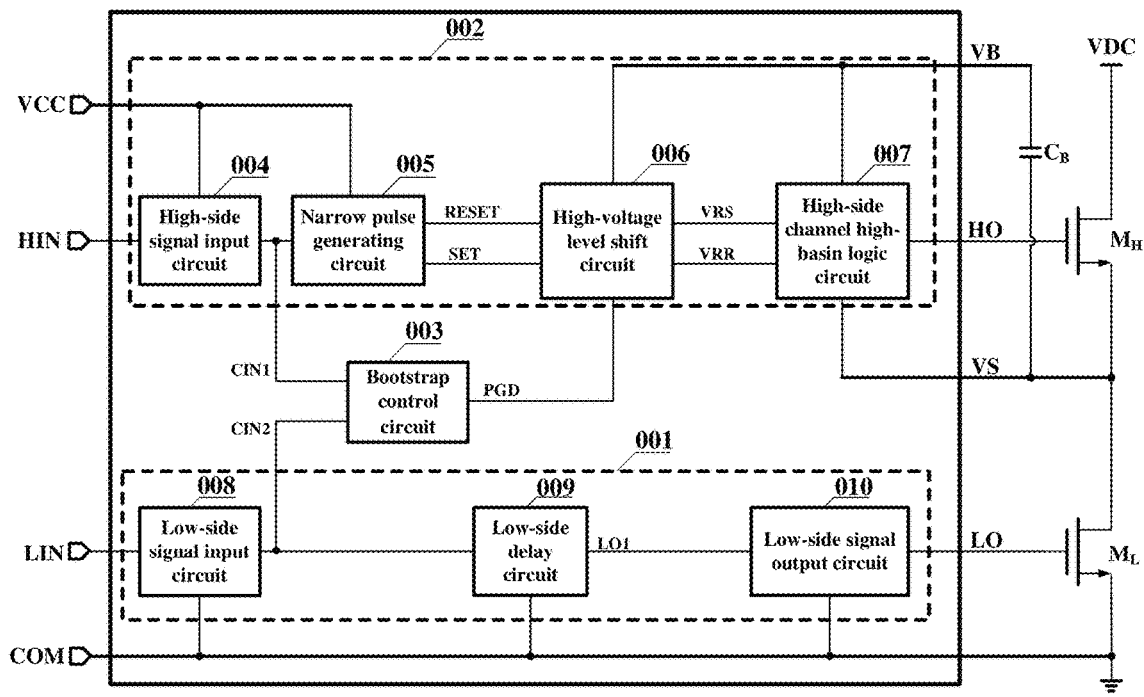
FIG. 5 is an embodiment of an integrated bootstrap half-bridge driver chip according to the present invention.

Referring to FIGS. 4 and 5, an integrated bootstrap high-voltage driver chip based on a driver circuit of a half-bridge structure according to the present invention comprises a low-side channel logic circuit 001 and a high-side channel logic circuit 002, wherein the high-side channel logic circuit 002 comprises a high-side signal input circuit 004, a narrow pulse generation circuit 005, a high-voltage level shift circuit 006 and a high-side channel high-basin logic circuit 007 (see FIG. 14) composed of two pulse filtering circuits with the same structure, an RS trigger and a high-side signal output circuit; the low-side channel logic circuit 001 comprises a low-side signal input circuit 008, a low-side delay circuit 009 and a low-side signal output circuit 010; a high-side input signal HIN is connected to the input end of the high-side signal input circuit 004, an output signal CIN1 of the high-side signal input circuit 004 is connected to the input end of the narrow pulse generation circuit 005, a low-voltage set signal SET and a low-voltage reset signal RESET outputted by the narrow pulse generation circuit 005 are respectively connected to two input ends of the high-voltage level shift circuit 006 (i.e., the grids of two high-voltage switch tubes), a high-voltage set signal VRS and a high-voltage reset signal VRR outputted by the high-voltage level shift circuit 006 are respectively connected to two input ends of the high-side channel high-basin logic circuit 007, and a high-side output signal HO outputted by the high-side channel high-basin logic circuit 007 is used as a gate driving signal of a high-side tube $M_H$ in the half-bridge structure; a low-side input signal LIN is connected to the input end of the low-side signal input circuit 008, an output signal CIN2 of the low-side signal input circuit 008 is connected to the input end of the low-side delay circuit 009, the output end of the low-side delay circuit 009 is connected to the input end of the low-side signal output circuit 010, the output of the low-side signal output circuit 010 is a low-side output signal LO and is used as a gate driving signal of a low-side tube ML in the half-bridge structure. In the circuits above, the high-voltage level shift circuit and the high-side channel high-basin logic circuit are located in a high-voltage circuit area powered by a high-side floating power supply VB, the other circuits are all located in a low-voltage circuit area and powered by a low-side fixed power supply VCC; in order to increase the utilization efficiency of the power supply, the half-bridge driver chip is powered by a single power supply, wherein the low-voltage area circuit is directly powered by a direct current power supply VCC, while the high-voltage area circuit is in a floating state, and is powered by an external bootstrap diode $D_B$ and an external bootstrap capacitor $C_B$ in a bootstrap manner; the power supply of the high-side signal input circuit 004, the narrow pulse generation circuit 005 and the low-side channel logic circuit 001 is the low-side fixed power supply VCC, a logic ground is a ground signal COM, the power supply of the high-side channel high-basin logic circuit 007 is the high-side floating power supply VB, a logic ground is a high-side floating ground VS, and the bootstrap capacitor $C_B$ is connected between the high-side floating power supply VB and the high-side floating ground VS; the high-voltage level shift circuit 006 is used as an interface of the high-voltage area circuit and the low-voltage area circuit, and comprises two subcircuits with the same structure, each subcircuit comprises a high-voltage switch tube (M01, M02), a Zener clamping diode (D01, D02) and a load (RL1, RL2), the Zener clamping diode is connected to the load in parallel, the drain of the high-voltage switch tube in each subcircuit is connected to the anode of the Zener clamping diode in the subcircuit and the connecting end of the load, the cathodes of the Zener clamping diodes in the two subcircuits are mutually connected to the connecting ends of the loads, and are connected to the high-side floating power supply VB; in the two subcircuits, the grid of the high-voltage switch tube of one subcircuit is connected to the low-voltage set signal SET outputted by the narrow pulse generation circuit 005, the drain of the high-voltage switch tube of the subcircuit outputs the high-voltage set signal VRS, the grid of the high-voltage switch tube of the other subcircuit is connected to the low-voltage reset signal RESET outputted by the narrow pulse generation circuit 005, and the drain of the high-voltage switch tube of the subcircuit outputs the high-voltage reset signal VRR. The circuit structures above all belong to the prior art.

The invention points of the present invention lie in that the bootstrap diodes $D_B$ is at least one parasitic diode implemented by integration technology, and matched with the bootstrap control circuit 003 provided to realize a bootstrap charging process together, the input signals of the bootstrap control circuit 003 are respectively the output signal CIN1 of the high-side signal input circuit 004 and the output signal CIN2 of the low-side signal input circuit 008, the output signal of the bootstrap control circuit 003 is a reference ground PGD, the reference ground PGD is connected to sources of two high-voltage switch tubes (M01, M02) in the high-voltage level shift circuit 006, when one parasitic diode is provided, the parasitic diode is defined as a first parasitic diode $D_{B1}$, the anode of the first parasitic diode $D_{B1}$ is connected to the reference ground PGD, and the cathode of the bootstrap control circuit is connected to the high-side floating power supply VB.

When the output signal PGD of the bootstrap control circuit 003 is at a low level (ground signal COM), the high-voltage level shift circuit 006 conducts level shift to the high-side signal; when the output signal PGD of the bootstrap control circuit (003) is at a high level which is a low-side fixed power supply voltage VCC, and when the input signal of the high-voltage level shift circuit 006 is at a low level (ground signal COM), the high-voltage level shift circuit 006 can also be used as a current channel for the VCC to charge the external bootstrap capacitor, which realizes to charge the bootstrap capacitor by the low-side fixed power supply VCC under the premise of guaranteeing the normal work of the high-voltage level shift circuit.

The charging process is as follows.

When the input signal CIN1 of the bootstrap control circuit 003 is at a low level (ground signal COM), and the input signal CIN2 is at a high level (low-side fixed power supply VCC), the output signal PGD of the bootstrap control circuit 003 is at a high level (low-side fixed power supply VCC), at the moment, the reference ground PGD charges the bootstrap capacitor $C_B$ through the first parasitic diode $D_{B1}$. Under other input conditions, the output reference ground PGD is at a low level (ground signal COM), at the moment, the first parasitic diode $D_{B1}$ is in a turned-off state, and a charging action is stopped.

When the input signal CIN1 of the bootstrap control circuit 003 is at a low level, and the output signal PGD is at a high level (low-side fixed power supply VCC), at the moment, the PGD charges the bootstrap capacitor through the first parasitic diode $D_{B1}$; when the input signal CIN1 is at a high level, and the output signal PGD is at a low level (ground signal COM), at the moment, the first parasitic diode $D_{B1}$ is in a turned-off state, and a charging action is stopped.

Figure 1:
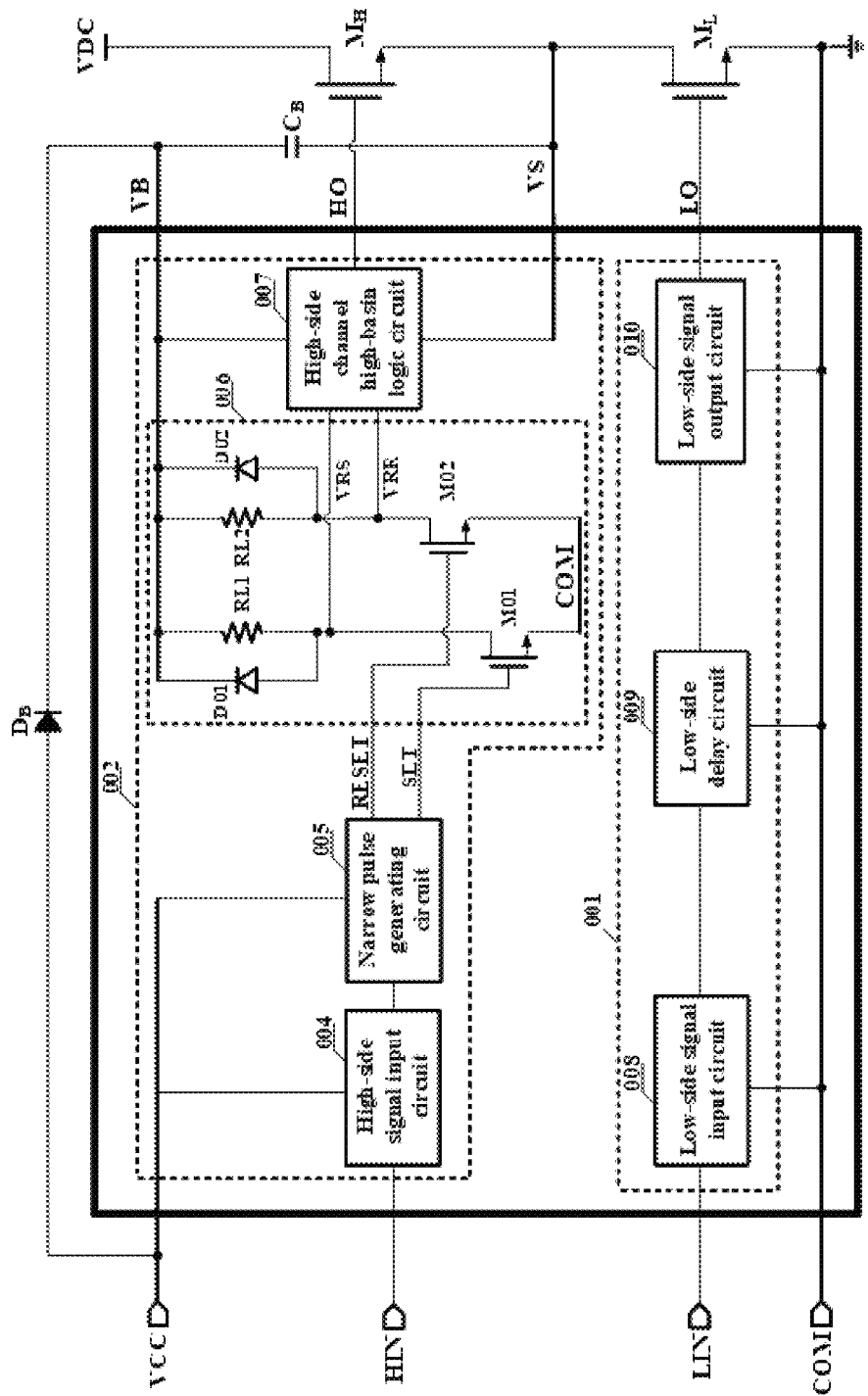
FIG. 1 is a conventional half-bridge driver chip and an external bootstrap circuit thereof.
Figure 2:
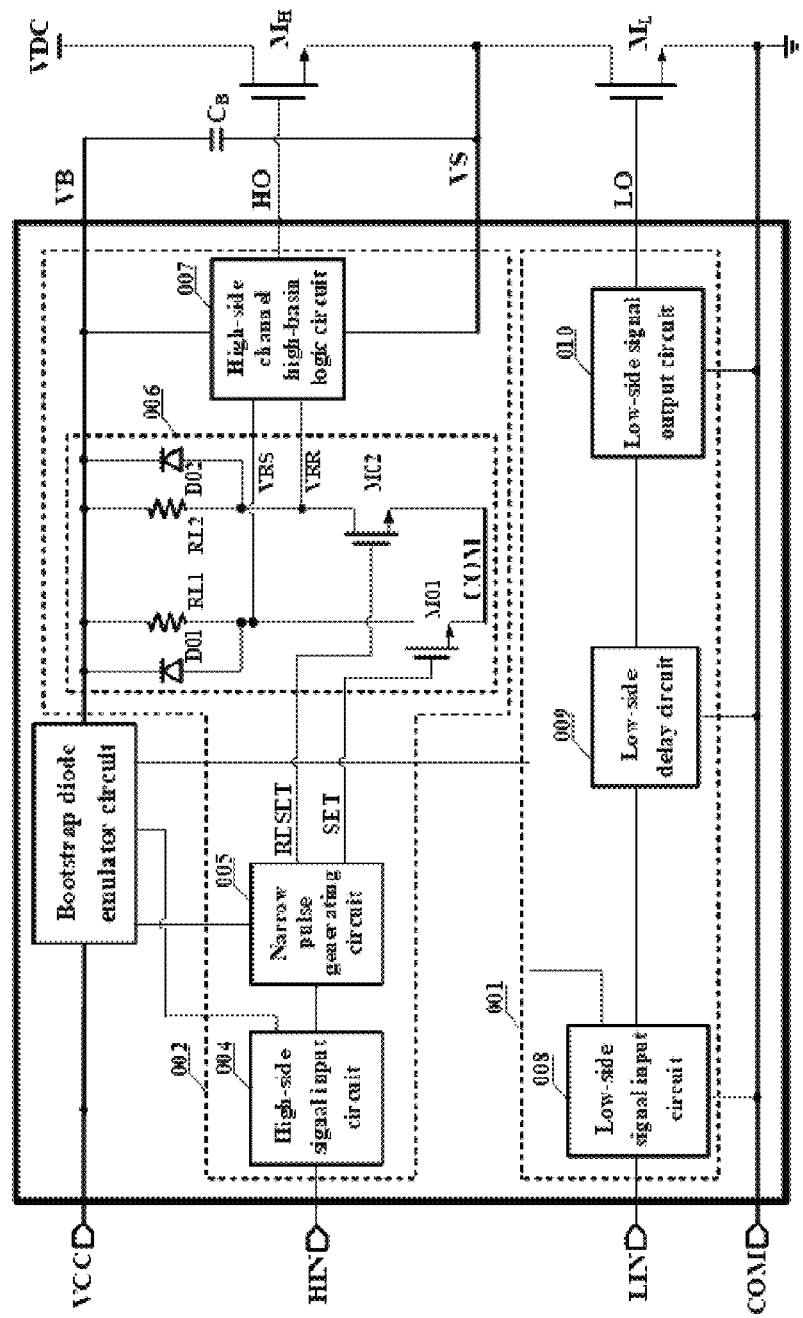
FIG. 2 is a conventional integrated bootstrap half-bridge driver chip and an external bootstrap circuit thereof.
Figure 6:
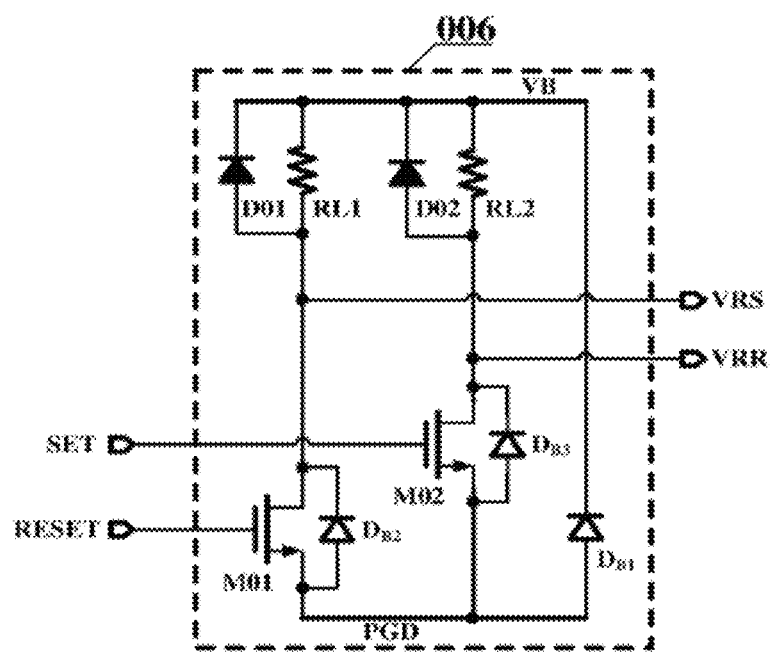
FIG. 6 is a first embodiment of a high-voltage level shift circuit according to the present invention.

Although the high-voltage level shift circuit 006 used in the present invention comprises two subcircuits with the same structure in the same manner as FIG. 1 of the prior art, the difference between the content shown in FIG. 6 and the content of the prior art is that both the sources of the high-voltage switch tubes (M01, M02) in the two subcircuits are connected to the output end PGD of the bootstrap control circuit 003 rather than being connected to the ground signal COM. Moreover, an entity high-voltage diode in the prior art is substituted by the first parasitic diode, the anode of the first parasitic diode $D_{B1}$ is connected to the reference ground PGD and the cathode of the first parasitic diode is connected to the high-side floating power supply VB, the two second parasitic diodes $D_{B2}$ are respectively connected between the sources and drains of the high-voltage switch tubes M01 and M02, the anode of the $D_{B2}$ is connected to the source of the high-voltage switch tube and the cathode of the $D_{B2}$ is connected to the drain of the high-voltage switch tube. (One $D_{B2}$ can also be set to be connected between the source and the drain of any high-voltage switch tube. When the low-side output signal LO is at a high level and the high-side output signal HO is at a low level, or when the low-side output signal LO is at a low level and the high-side output signal HO is at a low level, the output signal PGD of the bootstrap control circuit 003 is at a high level (low-side fixed power supply VCC), at the moment, if the differential voltage between the voltage of the PGD and the voltage of the high-side floating power supply VB is greater than the turning-on voltage drop of the first parasitic diode $D_{B1}$ or the second parasitic diode $D_{B2}(D_{B3})$, then the PGD charges the external bootstrap capacitor $C_B$ of the chip through the first parasitic diode $D_{B1}$ or the second parasitic diode $D_{B2}(D_{B3})$, if the differential voltage between the voltage of the PGD and the voltage of the high-side floating power supply VB is smaller than the turning-on voltage drop of the first parasitic diode $D_{B1}$ or the second parasitic diode $D_{B2(DB3)}$, then the first parasitic diode $D_{B1}$ and the second parasitic diode $D_{B2}(D_{B3})$ are turned off, and the charging action to the bootstrap capacitor $C_B$ is stopped; under other conditions, the output PGD of the bootstrap control circuit 003 is the ground signal COM, at the moment, the first parasitic diode $D_{B1}$ or the second parasitic diode $D_{B2}(D_{B3})$ is in a turned-off state, so that signal transmission is implemented by the high-voltage level shift circuit 006.

Figure 7:
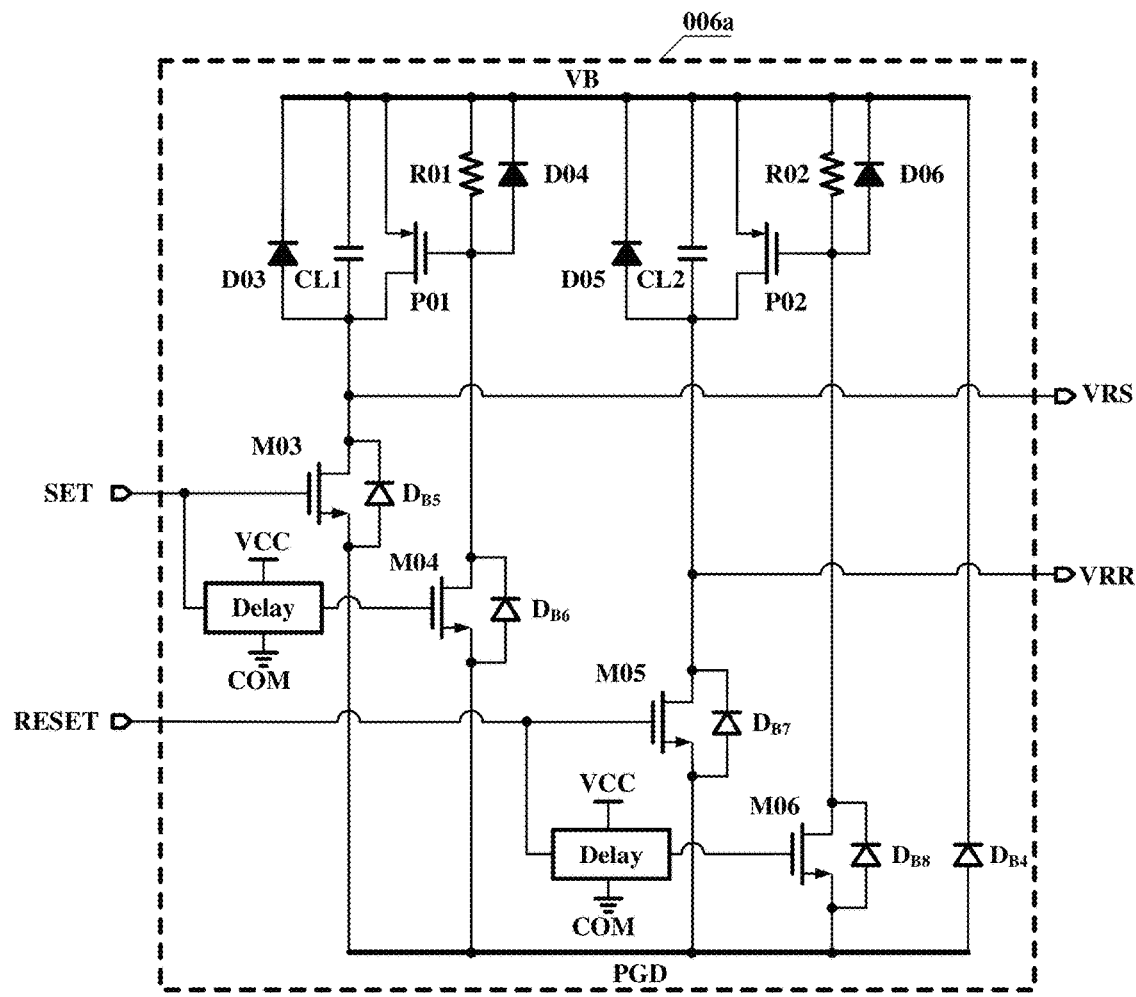
FIG. 7 is a second embodiment of the high-voltage level shift circuit according to the present invention.

The high-voltage level shift circuit 006 can be a resistive load or a capacitive load. FIG. 7 shows a high-voltage level shift circuit which is a capacitive load, comprising two parts with the same structure, wherein each part comprises a load capacitor charging channel and a load capacitor discharging channel, the charging channel comprises a high-voltage LDMOS device M03 (or M05), a load capacitor CL1 (or CL2) and a Zener clamping diode D03 (or D05), while the discharging channel comprises a delay circuit, a high-voltage LDMOS device M04 (or M06), a PMOS device P01 (or P02), a resistor R01 (or R02) and a Zener clamping diode D04 (or D06). A low-voltage set signal SET is connected to the grid of the M03, and the SET is connected to the M04 after one time delay; a low-voltage reset signal RESET is connected to the grid of the M05, and the RESET is connected to the M06 after one time delay; the drain end of the M03 is connected to the anode of the D03, one end of the CL1, and the drain end of the P01, the drain of the M04 is connected to the grid of the P01, one end of the R01 and the anode of the D04, the drain end of the M05 is connected to the anode of the D05, one end of the CL2 and the drain end of the P02, the drain of the M06 is connected to the grid of the P02, one end of the R02 and the anode of the D06, the sources of the M03, the M04, the M05 and the M06 are connected to the output PGD of the bootstrap control circuit, the cathode of the Zener clamping diode, the other end of the capacitive load and the other end of the resistor are connected to the source end of the PMOS and the high-side floating power supply, the drain end of the M03 is the high-voltage set signal VRS, and the drain end of the M05 is the high-voltage reset signal VRR. In addition, there is a first parasitic diode $D_{B4}$ between the VB and the PGD, the anode of the $D_{B4}$ is connected to the PGD, and the cathode of the $D_{B4}$ is connected to the VB; there are second parasitic diodes ($D_{B5}$, $D_{B6}$, $D_{B7}$ and $D_{B8}$) between the drain ends and the source ends of the M03, the M04, the M05 and the M06, the anodes of the second parasitic diodes are connected to the source end of the high-voltage LDMOS, and the cathodes of the second parasitic diodes are connected to the drain end of the high-voltage LDMOS. When the PGD is at a high level, the PGD directly charges the external bootstrap capacitor $C_B$ through the first parasitic diode, and the PGD also charges the external bootstrap capacitor $C_B$ through the second parasitic diodes, the Zener diodes and the PMOS; when the PGD is at a low level, both the first parasitic diode and the second parasitic diode are turned off, and signal transmission can be conducted in the high-side channel. The circuit structure has strong high dV/dt resistance capability and VS negative bias resistance capability, but the circuit structure is relatively complex.

Figure 8:
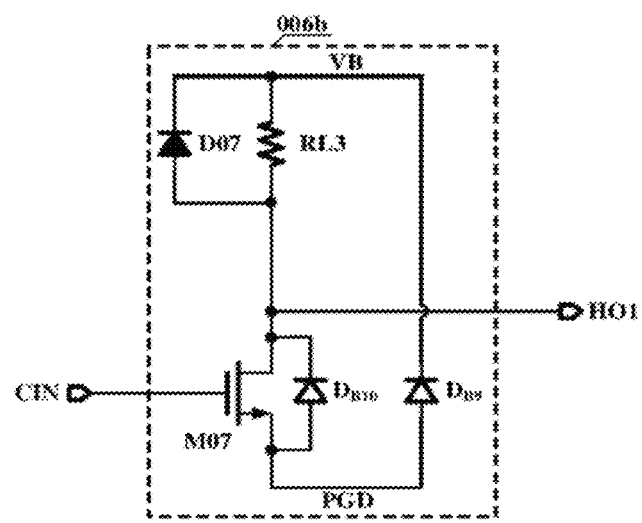
FIG. 8 is a third embodiment of the high-voltage level shift circuit according to the present invention.

The high-voltage level shift circuit 006 can also use the single-diode LDMOS device shown in FIG. 8 to realize the level shift function from low voltage to high voltage. If the high-voltage level shift circuit of such a structure is adopted, then the high-voltage driver chip does not comprise the narrow pulse generation circuit and an RS trigger signal recovery circuit in the high basin. The input signal CIN of the circuit is a wide pulse signal, and the CIN is the output signal of the high-side signal input circuit 004. The high-voltage level shift circuit 006 comprises a high-voltage LDMOS device M07, a load resistor RL3 and a Zener clamping diode D07, the CIN is connected to the grid end of the M07, the drain end of the M07 is connected to one end of the RL3 and the anode of the D07, the source of the M07 is connected to the output PGD of the bootstrap control circuit 003, the cathode of the D07 and the other end of the RL3 are connected to the high-side floating power supply VB, the drain end of the M07 is used as the output HO1 of the high-voltage level shift circuit 006 and is connected to the input end of the high-side signal output circuit, and the high-side signal output circuit and the low-side signal output circuit 010 are same in structure. The circuit structure is the simplest, but has the maximum power consumption, and is not suitable for working under a high voltage.

Figure 9:
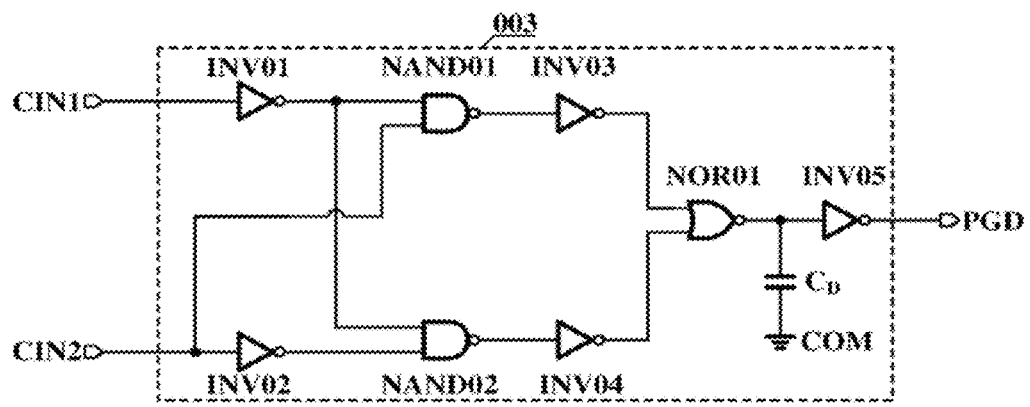
FIG. 9 is an embodiment of a bootstrap control circuit according to the present invention.

FIG. 9 is a specifically implemented circuit used by the bootstrap control circuit 003 according to the present invention. The function of the circuit is to control the logic reference ground voltage of the high-voltage level shift circuit 006, so as to control the high-voltage level shift circuit 006 to perform high-side signal transmission or bootstrap charging. The circuit comprises phase inverters (INV01, INV02, INV03, INV04 and INV05), nand gates (NAND01 and NAND02), and a nor gate NOR01, the output signals of the bootstrap control circuit are CIN1 and CIN2, the CIN1 is the output signal of the high-side signal input circuit and the CIN2 is the output signal of the low-side signal input circuit 008; the CIN1 is connected to the input end of the INV01, the CIN2 is connected to the input end of the INV02 and one input end of the NAND01, the output end of the INV01 is connected to the other input end of the NAND01 and one input end of the NAND02, the output end of the INV02 is connected to the other output end of the NAND02, the output end of the NAND01 is connected to the input end of the INV03, the output end of the NAND02 is connected to the input end of the INV04, the output end of the INV03 and the output end of the INV04 are used as the two input ends of the NOR01, the output end of the NOR01 is connected to the input end of the INV05 and one end of the $C_D$, the other end of the $C_D$ is connected to the ground signal COM, and the output signal of the INV05 is used as the output signal PGD of the bootstrap control circuit 003.

Figure 10:
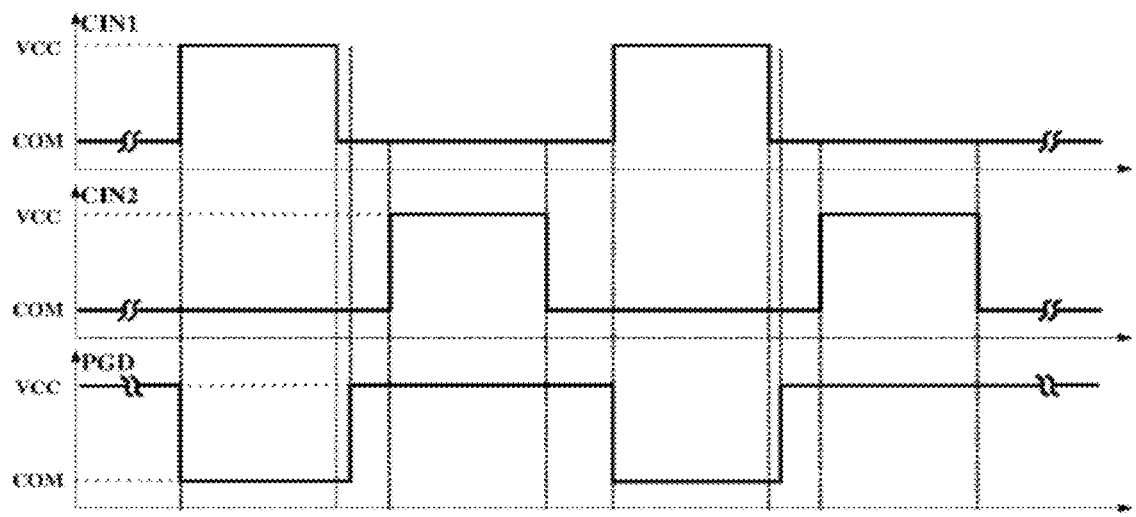
FIG. 10 is a working oscillogram of a bootstrap control circuit according to the present invention.

FIG. 10 is a working oscillogram of the bootstrap control circuit 003. The inputs CIN1 and CIN2 are square wave signals, when the CIN1 is at a low level and the CIN2 is at a high level, or when the CIN1 is at a low level and the CIN2 is at a low level, the output PGD of the bootstrap control circuit 003 is at a high level, and the output PGD is at a low level under other input conditions. When the PGD is at a low level, the first parasitic diode $D_{B1}$ and the second parasitic diode $D_{B2}$ are turned off all the time, at the moment, signal transmission can be conducted by the high-voltage level shift circuit 006; when the PGD is at a low level, signal transmission cannot be conducted by the high-voltage level shift circuit 006; at the moment, if the voltage of the high-side floating power supply VB is lower than the voltage of the PGD, and the first parasitic diode $D_{B1}$ or the second parasitic diode $DB_2$ is turned on, then the PGD will charge the bootstrap capacitor $C_B$ through the first parasitic diode $D_{B1}$ or the second parasitic diode $DB_2$.

Figure 11:
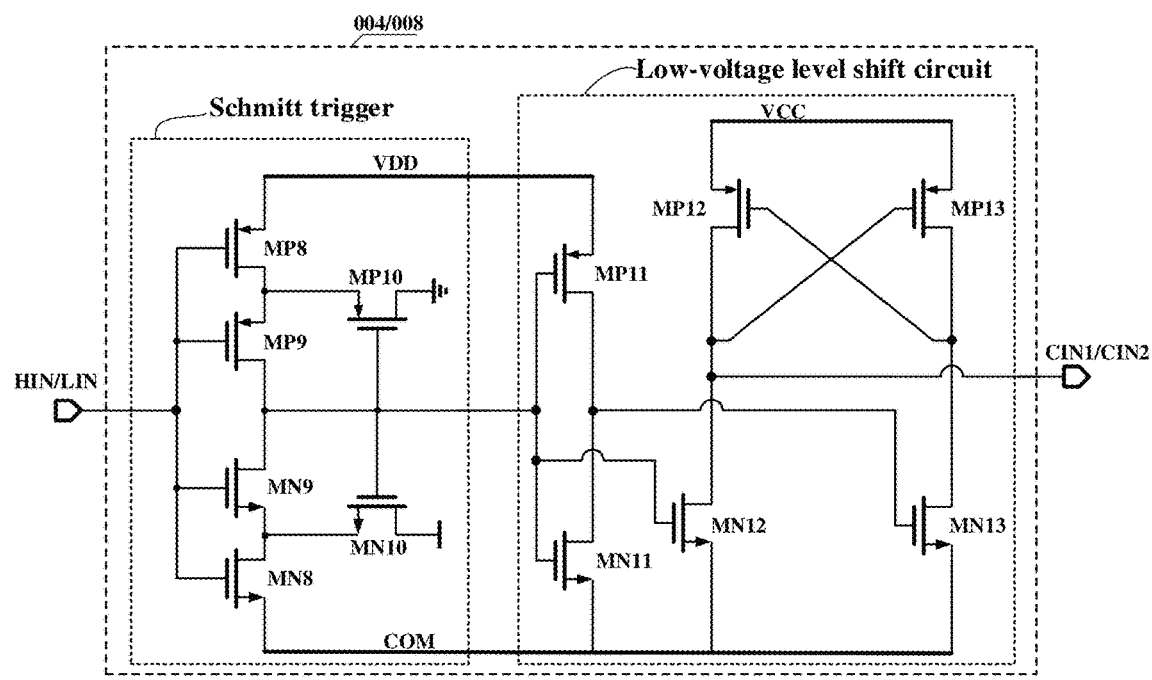
FIG. 11 is an embodiment of a high-side (low-side) signal input circuit according to the prior art.

FIG. 11 is a specifically implemented circuit of a high-side input signal input circuit 004 (or low-side input signal input circuit 008) in the prior art. The main function of the circuit is to suppress input noises and conduct level switch, so as to be compatible with different input logic levels. The circuit comprises a Schmitt trigger circuit and a low-voltage level shift circuit, wherein the Schmitt trigger circuit comprises NMOS tubes (MN8, MN9 and MN10) and PMOS tubes (MP8, MP9 and MP10); the high-side input signal HIN (or low-side input signal LIN) is connected to the input ends (the grids of the MN8, the MN9, the MP8 and the MP9)

of the Schmitt trigger, the drain of the MN8 and the source of the MN9 are connected to the source of the MN10, the drain of the MP8 and the source of the MP9 are connected to the source of the MP10, the drain of the MN9, the drain of the MP9 and the grid of the MP10 are connected to the grid of the MN10, and are used as the output signals of the Schmitt trigger, the source of the MP8 and the drain of the MN10 are connected to a reference voltage VDD, the reference voltage VDD is provided by an internal reference circuit, and the source of the MN8 and the drain of the MP10 are connected to the ground signal COM. The low-voltage level shift circuit comprises NMOS tubes (MN11, MN12 and MN13) and PMOS tubes (MP11 MP12 and MP13), the output end of the Schmitt trigger is connected to the grids of the MP11, the MN11 and the MN12, the drain of the MP11*m* and the drain of the MN11 are connected to the grid of the MN13, the drain of the MN13 and the drain of the MP13 are connected to the grid of the MP12, the drain of the MN12 and the drain of the MP12 are connected to the grid of the MP13, and are used as the output end CIN1 (or CIN2) of the low-voltage level shift circuit, the source of the MP11 is connected with the reference voltage VDD, the grids of the MP12 and the MP13 are connected to the low-side fixed power supply VCC, and the sources of the MN11, the MN12 and the MN13 are connected to the ground signal COM.

Figure 12:
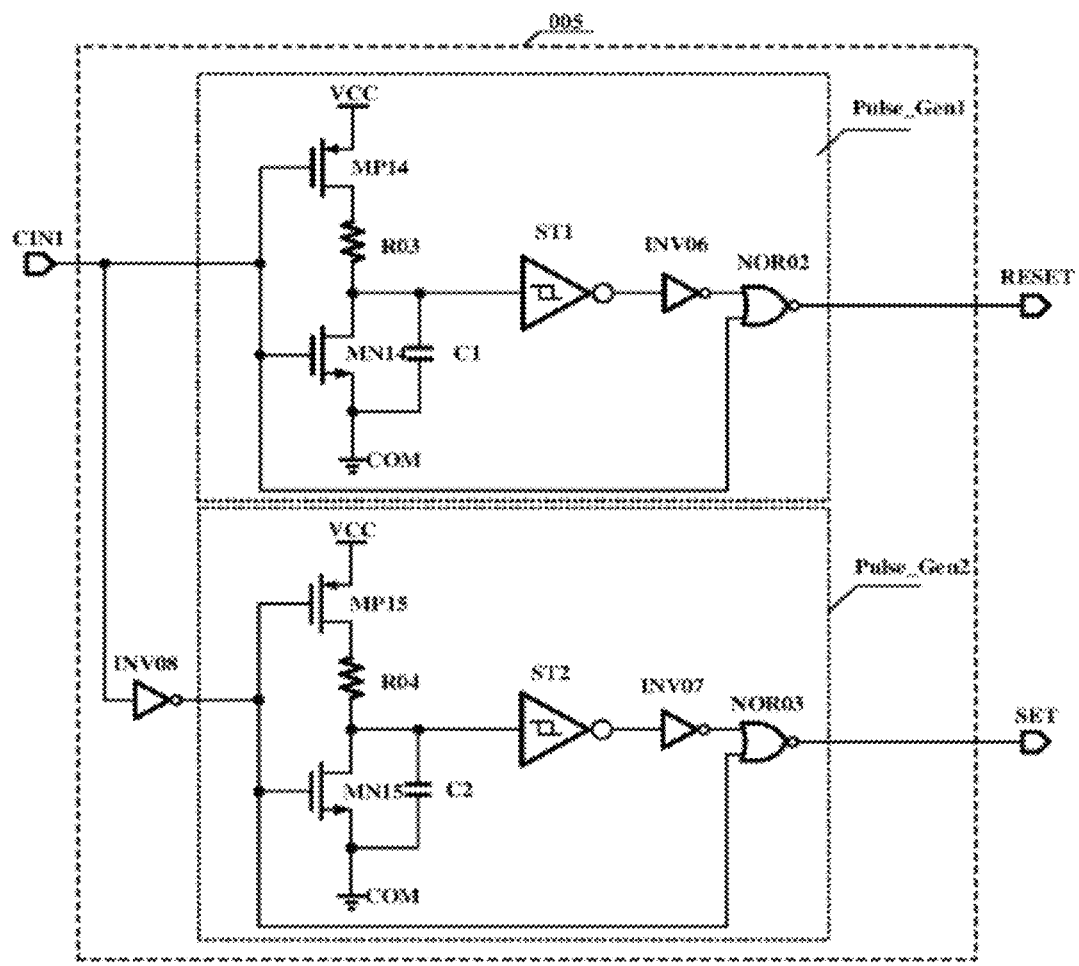
FIG. 12 is an embodiment of a narrow pulse generation circuit according to the prior art.

FIG. 12 is a specifically implemented circuit of a narrow pulse generation circuit 005 according to the prior art. The function of the circuit is to generate a low-voltage set signal SET and a low-voltage reset signal RESET at the rising edge and the falling edge of an input signal respectively to control the turning-on of an LDMOS in a form of narrow pulse, so as to reduce the turning-on time of the LDMOS and reduce the LDMOS losses. The circuit is composed of two single pulse generating circuits (Pulse_Gen1 and Pulse_Gen2) with the same structure and a phase inverter INV08. The output signal CIN1 of the high-side signal input circuit 004 is connected to the input of the single pulse generating circuit Pulse_Gen1 and the input end of the phase inverter INV08, the output of the Pulse_Gen1 is the low-voltage reset signal RESET, the output end of the phase inverter INV08 is connected to the input end of the single pulse generating circuit Pulse_Gen2, and the output of the Pulse_Gen2 is the low-voltage set signal SET. The single impulse generating circuit Pulse_Gen1 comprises a delay circuit, a Schmitt trigger ST1, a phase inverter INV06 and a nor gate NOR02, wherein the delay circuit is composed of a PMOS tube MP14, an NMOS tube MN14, a resistor R03 and a capacitor C1, the grids of the MP14 and the MN14 are connected and used as the input end of the delay circuit, the drain of the MP14 is connected to one end of the resistor R03, the drain of the MN14, the other end of the R03 and one end of the capacitor C1 are connected and used as the output end of the delay circuit, the source of the MP14 is connected to the low-side fixed power supply VCC, the source of the MN14 is connected to the ground signal COM, the input end of the delay circuit is connected to one input end of the nor gate NOR02 and used as the input end of the Pulse_Gen1, the output of the delay circuit is connected to the input end of the Schmitt trigger ST1, the output of the ST1 is connected to the input end of the phase inverter INV06, the output of the INV06 is connected to the other input end of the NOR02, and the output of the NOR02 is used as the output end of the Pulse_Gen1.

Figure 13:
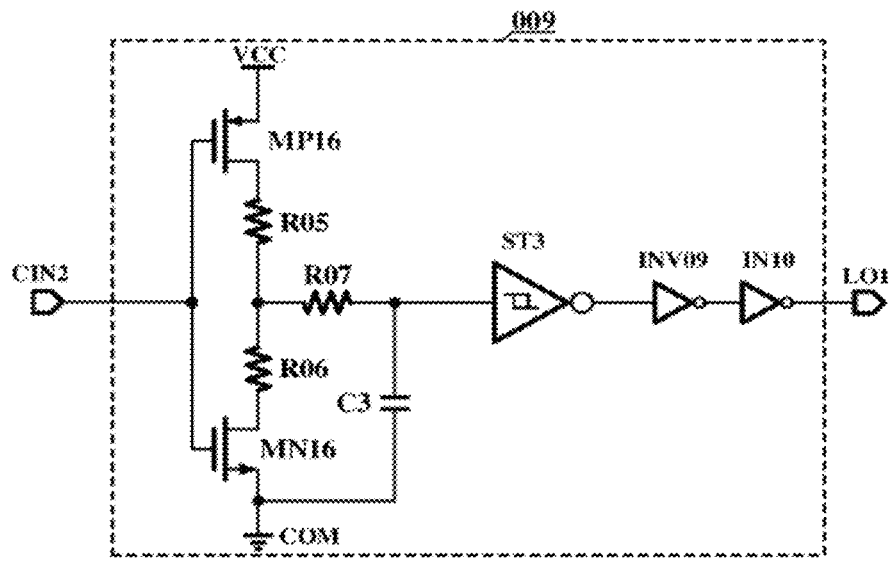
FIG. 13 is an embodiment of a low-side delay circuit according to the prior art.

FIG. 13 is a specifically implemented circuit of a low-side delay circuit 009 according to the prior art. The function of the circuit is to match the transmission delay of the high-side and low-side input and output signals. The input signal of the circuit is CIN2 which is from the output of the low-side signal input circuit 008, the CIN2 is connected to the grid of the PMOS tube MP16 and the grid of the NMOS tube MN16, the drain of the MP16 is connected to one end of a resistor R05, the drain of the MN16 is connected to one end of a resistor R06, the other end of the resistor R05, the other end of the R06 and one end of a resistor R07 are connected, the other end of the R07 is connected to one end of a capacitor 03 and used as the input signal of the Schmitt trigger ST3, the output signal of the Schmitt trigger ST3 passes through two-stage phase inverters INV09 and INV15, and then outputs LO1, and the LO1 is used as the input signal of the low-side signal output circuit 010.

Figure 14:
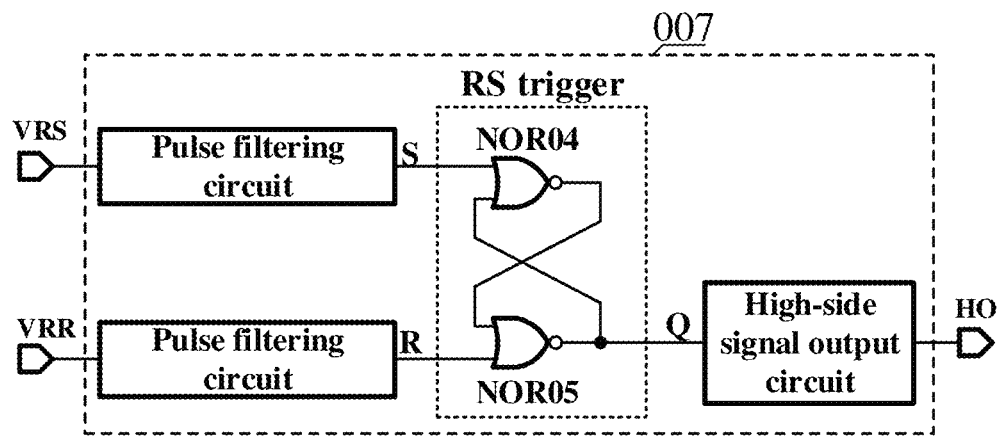
FIG. 14 is an embodiment of a high-side channel high-basin logic circuit according to the prior art.
Figure 15:
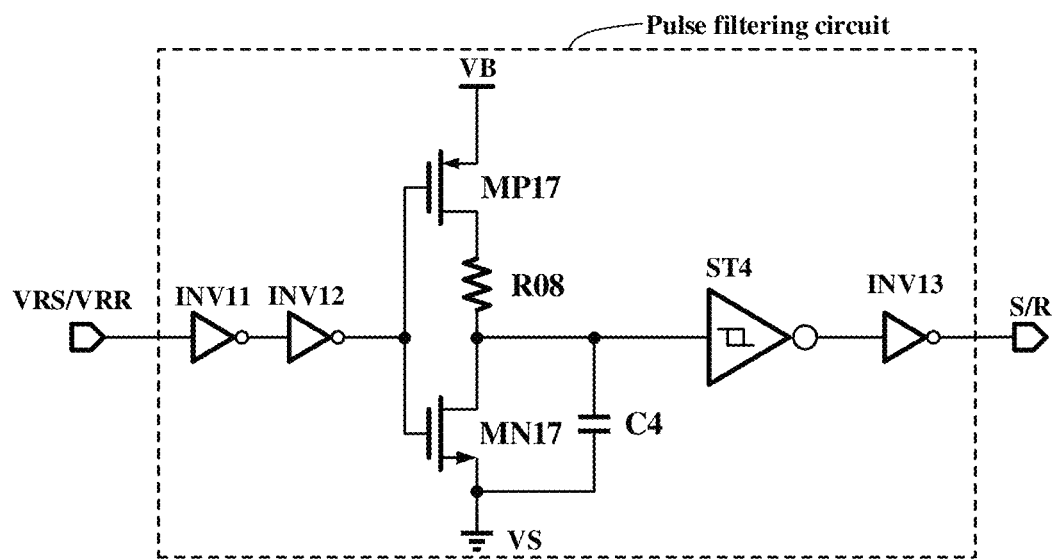
FIG. 15 is an embodiment of a pulse filtering circuit according to the prior art.
Figure 16:
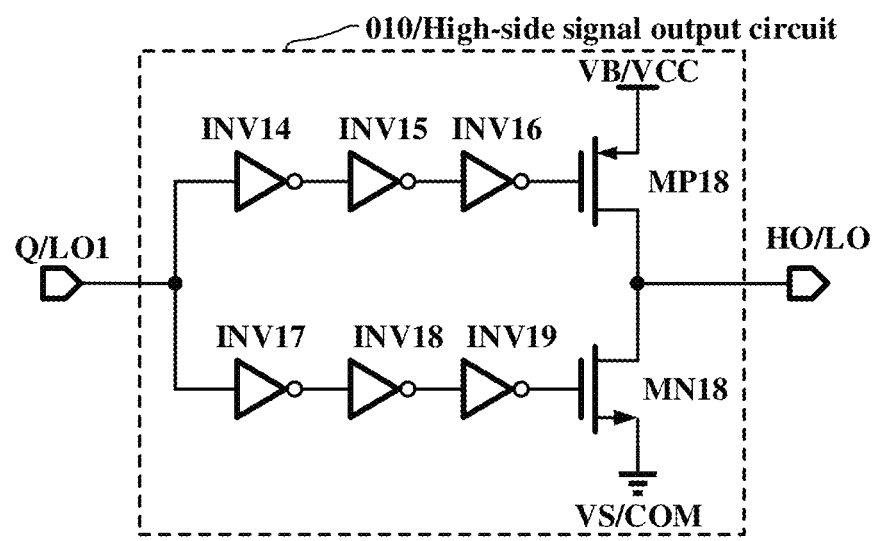
FIG. 16 is an embodiment of a high-side (low-side) signal output circuit according to the prior art.

FIG. 14 is a specifically implemented circuit of a high-side channel high-basin logic circuit 007 according to the prior art. The function of the circuit is to filter the output signal of the high-voltage level shift circuit 006 and recover two narrow pulse signals into one wide pulse signal, and has stronger current output capability at the same time to drive the high-voltage power devices external the chip. The circuit comprises two pulse filtering circuits with the same structure, an RS trigger and a high-side signal output circuit. The pulse filtering circuit, as shown in FIG. 15, is composed of phase inverters (INV16, INV17 and INV18), a delay circuit and a Schmitt trigger circuit, the high-voltage set signal VRS (or high-voltage reset signal VRR) is connected to the input end of the phase inverter INV16, the output signal of the INV16 is connected to the input signal of the phase inverter INV17, the output signal of the INV17 is connected to the grid of the MP17 and the grid of the MN17, the drain of the MP17 is connected to one end of a resistor R08, the drain of the MN17 is connected to the other end of the resistor R08 and one end of a capacitor C4 and used as the input signal of the Schmitt trigger ST4, the output signal of the ST4 is connected to the input signal of the phase inverter INV18, and the output signal S (or R) of the INV18 is used as the input signal of the RS trigger. The RS trigger is composed of two nor gates (NOR04 and NOR05), one input signal of the NOR04 is S and another input signal of the NOR04 is connected to the output signal Q of the NOR05, one input signal of the NOR05 is R and another input signal of the NOR05 is connected to the output of the NOR04, and the output signal Q of the RS trigger controls the high-side signal output circuit. The high-side signal output circuit is as shown in FIG. 16. The output signal Q of the RS trigger is connected to the input ends of the phase inverters INV14 and INV17, the output signal of the INV14 controls the phase inverter INV15, the output signal of the INV15 controls the phase inverter INV16, the output signal of the INV16 is connected to the grid of a PMOS tube MP18, the phase inverters INV17, INV18 and INV19 are connected in series, the output signal of the INV19 is connected to an NMOS tube MN18, the drain of the MP18 is in line connection with the drain of the MN18 and used as the high-side output signal HO.

FIG. 16 is a structural diagram of an implementation circuit of a low-side signal output circuit 010 according to the prior art. The function of the circuit is to strengthen the current drive capability of the low-side output signal LO so as to drive power switch devices external the chip. The circuit structure of the low-side output signal and the circuit structure of the high-side signal output circuit are the same, the input signal LO1 is the output signal of the low-side delay circuit 009, and the output signal of the low-side signal output circuit 010 is the low-side output signal LO.

Figure 17:
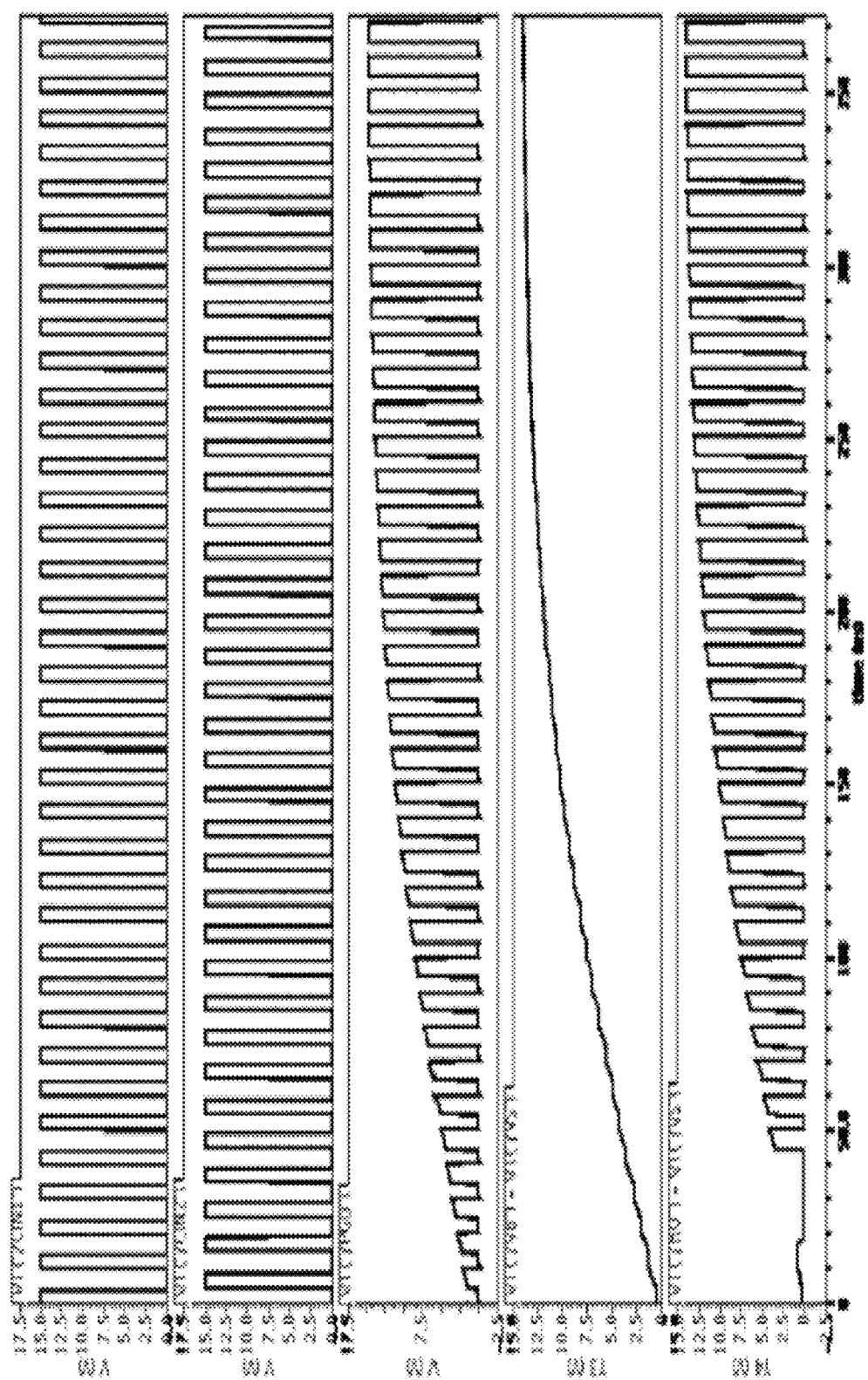
FIG. 17 is a emulation oscillogram of a novel integrated bootstrap half-bridge driver chip according to the present invention.

FIG. 17 shows the specific working waveform of the circuit for controlling bootstrap charging as shown in FIG.

9. When the high-side input signal HIN is at a low level and the low-side input signal LIN is at a high level, the output PGD of the bootstrap control circuit 003 is at a high level, and the PGD charges the external bootstrap capacitor $C_B$ through the first parasitic diode and the second parasitic diode, so that the differential voltage between the high-side floating power supply VB and the high-side floating ground VS is increased; under other HIN and LIN input conditions, the charging circuit stops charging the external bootstrap capacitor $C_B$, the differential voltage between the VB and the VS keeps constant, and signal transmission can be conducted at the high-side channel.

The integrated bootstrap high-voltage driver chip of the present invention can also be implemented by other technological structure. For example, an SOI technology is used to integrate a bootstrap diode to a half-bridge driver chip; the anode of the bootstrap diode is connected to the output terminal PGD of the bootstrap control circuit 003, and the cathode of the bootstrap diode is connected to the high-side floating power supply VB; when the voltage of the PGD is at a high level (low-side fixed power supply VCC), the VCC can charge the external bootstrap capacitor through the integrated bootstrap diode.

Although the invention has been described in some embodiments, further modifications may be made within the spirit and scope of the invention. Any simple and equivalent modifications, changes, and equivalent structural transformations made to the above embodiments according to the technical essence of the invention shall fall within the protection scope of the technical solutions of the invention.

What is claimed is:

1. An integrated bootstrap high-voltage driver chip based on a driver circuit of a half-bridge structure, comprising a low-side channel logic circuit (001) and a high-side channel logic circuit (002), wherein the high-side channel logic circuit (002) comprises a high-side signal input circuit (004), a narrow pulse generation circuit (005), a high-voltage level shift circuit (006) and a high-side channel high-basin logic circuit (007) composed of two pulse filtering circuits with the same structure, an RS trigger and a high-side signal output circuit; the low-side channel logic circuit (001) comprises a low-side signal input circuit (008), a low-side delay circuit (009) and a low-side signal output circuit (010); a high-side input signal (HIN) is connected to the input end of the high-side signal input circuit (004), an output signal (CIN1) of the high-side signal input circuit (004) is connected to the input end of the narrow pulse generation circuit (005), a low-voltage set signal (SET) and a low-voltage reset signal (RESET) outputted by the narrow pulse generation circuit (005) are respectively connected to two input ends of the high-voltage level shift circuit (006), a high-voltage set signal (VRS) and a high-voltage reset signal (VRR) outputted by the high-voltage level shift circuit (006) are respectively connected to two input ends of the high-side channel high-basin logic circuit (007), and a high-side output signal (HO) outputted by the high-side channel high-basin logic circuit (007) is used as a gate driving signal of a high-side tube in the half-bridge structure; a low-side input signal (LIN) is connected to the input end of the low-side signal input circuit (008), an output signal (CIN2) of the low-side signal input circuit (008) is connected to the input end of the low-side delay circuit (009), the output end of the low-side delay circuit (009) is connected to the input end of the low-side signal output circuit (010), and the output of the low-side signal output circuit (010) is a low-side output signal (LO) and is used as a gate driving signal of a low-side tube in the half-bridge structure; in the circuits above, the high-voltage level shift circuit (006) and the high-side channel high-basin logic circuit (007) are located in a high-voltage circuit area and powered by a high-side floating power supply (VB), the other circuits are all located in a low-voltage circuit area and powered by a low-side fixed power supply (VCC); in order to increase the utilization efficiency of the power supply, the half-bridge driver chip is powered by a single power supply, wherein the low-voltage area circuit is directly powered by a direct current power supply, while the high-voltage area circuit is in a floating state, and is powered by an external bootstrap diode ($D_{B-}$) and an external bootstrap capacitor ($C_{B-}$) in a bootstrap manner; the power supply of the high-side signal input circuit (004), the narrow pulse generation circuit (005) and the low-side channel logic circuit (001) is the low-side fixed power supply (VCC), a logic ground is a ground signal (COM), the power supply of the high-side channel high-basin logic circuit (007) is the high-side floating power supply (VB), a logic ground is a high-side floating ground (VS), and the bootstrap capacitor ($C_{B-}$) is connected between the high-side floating power supply (VB) and the high-side floating ground (VS); the high-voltage level shift circuit (006) is used as an interface of the high-voltage area circuit and the low-voltage area circuit, and comprises two subcircuits with the same structure, each subcircuit comprises a high-voltage switch tube, a Zener clamping diode and a load, the Zener clamping diode is connected to the load in parallel, the drain of the high-voltage switch tube in each subcircuit is connected to the anode of the Zener clamping diode in the subcircuit and the connecting end of the load, cathodes of the Zener clamping diodes in the two subcircuits are mutually connected to the connecting ends of the loads, and are connected to the high-side floating power supply (VB); in the two subcircuits, the grid of the high-voltage switch tube of one subcircuit is connected to the low-voltage set signal (SET) outputted by the narrow pulse generation circuit (005), the drain of the high-voltage switch tube of the subcircuit outputs the high-voltage set signal (VRS), the grid of the high-voltage switch tube of the other subcircuit is connected to the low-voltage reset signal (RESET) outputted by the narrow pulse generation circuit (005), and the drain of the high-voltage switch tube of the subcircuit outputs the high-voltage reset signal (VRR);

wherein, the bootstrap diodes ($D_{B-}$) is at least one parasitic diode implemented by integration technology, and matched with the bootstrap control circuit (003) provided to realize a bootstrap charging process together, the input signals of the bootstrap control circuit (003) are respectively the output signal (CIN1) of the high-side signal input circuit (004) and the output signal (CIN2) of the low-side signal input circuit (008), the output signal of the bootstrap control circuit (003) is a reference ground (PGD), the reference ground (PGD) is connected to sources of two high-voltage switch tubes in the high-voltage level shift circuit (006), when one parasitic diode is provided, the parasitic diode is defined as a first parasitic diode ($D_{B1}$), the anode of the first parasitic diode ($D_{B1}$) is connected to the reference ground PGD, and the cathode of the bootstrap control circuit is connected to the high-side floating power supply VB;

when the output signal (PGD) of the bootstrap control circuit (003) is at a low level which is a ground signal (COM), the high-voltage level shift circuit (006) conducts level shift to the high-side signal; when the output signal (PGD) of the bootstrap control circuit (003) is at a high level which is a low-side fixed power supply voltage (VCC), and when the input signal of the high-voltage level shift circuit (006) is at a low level which is the ground signal (COM), the high-voltage level shift circuit (006) can also be used as a current channel for the VCC to charge the external bootstrap capacitor, which realizes to charge the bootstrap capacitor by the low-side fixed power supply (VCC) under the premise of guaranteeing the normal work of the high-voltage level shift circuit;

the charging process is as follows:

when the input signal (CIN1) of the bootstrap control circuit (003) is at a low level which is the ground signal (COM), and the input signal (CIN2) is at a high level which is the low-side fixed power supply (VCC), the output signal (PGD) of the bootstrap control circuit (003) is at a high level which is the low-side fixed power supply (VCC), at the moment, the reference ground (PGD) charges the bootstrap capacitor ($C_B$) through the first parasitic diode $D_{B1}$; when the input signal (CIN1) of the bootstrap control circuit (003) is at a low level, and the input signal (CIN2) is at a low level which is the ground signal (COM), the output signal (PGD) is at a high level (the low-side fixed power supply (VCC), at the moment, the PGD charges the bootstrap capacitor through the first parasitic diode ($D_{B1}$); when the input signal (CIN1) is at a high level, and the input signal (CIN2) is at a low level, or when the input signals (CIN1) and (CIN2) are at a high level at the same time, the output signal (PGD) is at a low level which is the ground signal (COM), at the moment, the first parasitic diode ($D_{B1}$) is in a turned-off state, and a charging action is stopped.

2. The integrated bootstrap high-voltage driver chip according to claim 1, wherein the load in the high-voltage level shift circuit (006) is a resistive load or capacitive load.

3. The integrated bootstrap high-voltage driver chip according to claim 1, wherein a second parasitic diode ($D_{B2}$) is arranged between the source and the drain of any one of the two high-voltage switch tubes in the high-voltage level shift circuit (006), or a second parasitic diode ($D_{B2}$) is respectively arranged between the sources and the drains of the two high-voltage switch tubes, the anode of the second parasitic diode ($D_{B2}$) is connected to the source of the high-voltage switch tube, and the cathode of the bootstrap control circuit is connected to the drain of the high-voltage switch tube;

the charging process is as follows:

when the low-side output signal (LO) is at a high level and the high-side output signal (HO) is at a low level, or when the low-side output signal (LO) is at a low level and the high-side output signal (HO) is at a low level, the output signal (PGD) of the bootstrap control circuit (003) is at a high level which is the low-side fixed power supply (VCC), at the moment, if the differential voltage between the voltage of the PGD and the voltage of the high-side floating power supply (VB) is greater than the turning-on voltage drop of the first parasitic diode or the second parasitic diode, then the PGD charges the external bootstrap capacitor ($C_B$) of the chip through the first parasitic diode or the second parasitic diode, if the differential voltage between the voltage of the PGD and the voltage of the high-side floating power supply (VB) is smaller than the turning-on voltage drop of the first parasitic diode or the second parasitic diode, then the first parasitic diode and the second parasitic diode are turned off, and the charging action to the bootstrap capacitor ($C_B$) is stopped; under other conditions, the PGD of the bootstrap control circuit (003) is the ground signal (COM), at the moment, the first parasitic diode or the second parasitic diode is in a turned-off state, so that signal transmission is implemented by the high-voltage level shift circuit (006).

4. The integrated bootstrap high-voltage driver chip according to claim 1, wherein the bootstrap control circuit (003) comprises five phase inverters (INV01, INV02, INV03, INV04 and INV05), two nand gates (NAND01 and NAND02), and a nor gate (NOR01), the output signal (CIN1) of the high-side signal input circuit (004) and the output signal (CIN2) of the low-side signal input circuit (008) are respectively connected to the input ends of the phase inverters (INV01 and INV02), the output end of the phase inverter (INV01) is respectively connected to one input end of the nand gate (NAND01) and one input end of the nand gate (NAND02), the other input end of the nand gate (NAND01) is connected to the input end of the phase inverter (INV02), the other input end of the nand gate (NAND02) is connected to the output end of the phase inverter (INV02), the output end of the nand gate (NAND01) is connected to the input end of the phase inverter (INV03), the output end of the nand gate (NAND02) is connected to the input end of the phase inverter (INV04), the output end of the phase inverter (INV03) and the output end of the phase inverter (INV04) are respectively connected to the two input ends of the nor gate (NOR01), the output end of the nor gate (NOR01) is connected to the input end of the phase inverter (INV05) and one end of a capacitor ($C_D$), the other end of the capacitor ($C_D$) is connected to the ground signal (COM), and the output signal of the phase inverter (INV05) is the reference ground (PGD).

5. A technological structure of the integrated bootstrap high-voltage driver chip according to claim 1, comprising a low basin composed of a first doping-type base (101), a second doping-type buried layer (102), a second doping-type trap (103) and a first doping-type trap (104); a high-voltage switch tube composed of a first doping-type trap (105), a second doping-type buried layer (106), a first doping-type body contact (107), a second doping-type source contact (108), a second doping-type drain contact (109), a grid (110) and a second doping-type trap (111); and a high basin composed of a second doping-type buried layer (112), a second doping-type trap (113) and a first doping-type trap (114); the low basin being close to the source of the high-voltage switch tube, and the high basin being close to the drain of the high-voltage switch tube, wherein:

the low basin is provided with at least one second doping-type trap (103) and at least one first doping-type trap (104), and the first doping-type trap (104) is always surrounded by the second doping-type trap (103) and the second doping-type buried layer (102); the first doping-type base (101) is not connected to any electric potential; the first doping-type body contact (107) and the second doping-type source contact (108) are connected to the reference ground (PGD); the second doping-type trap (113) in the high basin is electrically connected to the high-side floating power supply (VB), and the second doping-type trap (103) in the low basin is electrically connected to the low-side fixed power supply (VCC); all the low-voltage area circuits in the high-voltage driver chip are prepared in the first doping-type trap (104), and all the high-voltage area circuits are prepared in the first doping-type trap (114); a first parasitic diode is composed of the first doping-type base (101), the second doping-type buried layer (112) and the second doping-type trap (113), and a second parasitic diode is composed of the first doping-type base (101), the second doping-type buried layer (106) and a second doping-type trap (115).

6. The technological structure of the integrated bootstrap high-voltage driver chip according to claim 5, wherein the low-side channel logic circuit (001), the high-side signal input circuit (004), the narrow pulse generation circuit (005) and the bootstrap control circuit (003) are prepared in the first doping-type trap (104) in the low basin, the high-side channel high-basin logic circuit (007) is prepared in the first doping-type trap (114) in the high basin, and the PGD of the bootstrap control circuit (003) is connected to the first doping-type body contact (107) and the second doping-type source contact (108) in the high-voltage switch tube.

\* \* \* \* \*